(12) United States Patent
Lindstrom et al.

(10) Patent No.: US 7,177,382 B2
(45) Date of Patent: Feb. 13, 2007

(54) FULLY INTEGRATED BROADBAND TUNER

(75) Inventors: Mats Lindstrom, San Diego, CA (US); Brian K. Terry, Carlsbad, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 429 days.

(21) Appl. No.: 10/786,921

(22) Filed: Feb. 25, 2004

(65) Prior Publication Data

US 2004/0164812 A1    Aug. 26, 2004

Related U.S. Application Data

(62) Division of application No. 09/497,717, filed on Feb. 4, 2000, now Pat. No. 6,731,712.

(51) Int. Cl.
*H03D 3/24* (2006.01)
*H03C 7/06* (2006.01)

(52) U.S. Cl. ............... 375/376; 375/373; 327/156

(58) Field of Classification Search ............ 375/376, 375/373, 374, 375, 316; 327/156, 157; 455/313, 455/323, 260
See application file for complete search history.

(56) References Cited

U.S. PATENT DOCUMENTS 4,446,564 A * 5/1984 Pierce ..................... 375/222
5,389,898 A * 2/1995 Taketoshi et al. ........... 331/2
2002/0000136 A1* 1/2002 Ueno et al. ................. 375/376

* cited by examiner

*Primary Examiner*—Khai Tran
(74) *Attorney, Agent, or Firm*—Hogan & Hartson LLP

(57) ABSTRACT

A fully integrated single-loop frequency synthesizer, which can serve as a local oscillator for a broadband tuner, is disclosed, thus allowing the creation of a single-chip solution for broadband applications. The tank circuits are integrated into the tuner chip through the combination of a phase-locked loop and multiple on-chip VCOs comprising narrow-tuning range varactors. Drift in the VCOs caused by heat is overcome by designing the VCOs to overlap each other. Initial tolerance problems associated with the VCOs are overcome by the use of a calibration method. The calibration of the VCOs is accomplished by utilizing the lock detect output of the phase-locked loop and a binary search algorithm. The edges of each VCO are determined with this calibration method, thereby enabling VCO selection based on the desired channel. A sufficient number of VCOs are provided such that whatever the initial tolerance shift, the full broadband spectrum can still be covered after calibration. Additionally, the problem of coupling between the local oscillator signal and the incoming radio frequency signal is mediated by the use of a programmable 2/4 divider. This 2/4 divider also provides additional flexibility in choosing the number of VCOs to put on the chip and which VCO to use in a particular implementation.

8 Claims, 6 Drawing Sheets

Broadcast Satellite

FULLY INTEGRATED BROADBAND TUNER

This is a divisional of application Ser. No. 09/497,717, filed on Feb. 4, 2000 now U.S. Pat. No. 6,731,712.

BACKGROUND OF THE INVENTION

1. Field of the Invention

The present invention relates generally to broadcast receivers, and more particularly to broadband tuners utilizing a local oscillator.

2. Related Art

Broadcast satellites transmit signals over multiple channels across a broadband spectrum. These satellites may be combined with receiving systems to create a direct broadcast satellite system (DBS). A current example of such a system is Digital Satellite Service/Direct Video Broadcast (DSS/DVB), which broadcasts over the range 12 to 14 GHz. A DSS/DVB receiving system generally includes an antenna, a low-noise block converter (LNB) and a direct down-conversion broadband receiver. The direct down-conversion receiver comprises a tuner, an analog-to-digital converter and a baseband demodulator. The LNB converts the 12–14 GHz band signal received by the antenna into a 950–2150 MHz band signal. The tuner directly converts this 950–2150 MHz band down to baseband, which consists of in-phase (I) and quadrature (Q) components. These I and Q components are then transformed into digital data by the analog-to-digital converter and demodulated by the baseband demodulator to decode the video and audio being broadcast.

The tuners in such systems typically utilize mixers to perform the down-conversion from 950–2150 MHz to I and Q components. These mixers require a local oscillator, which typically consists of a frequency synthesizer with a step size equal to the receive channel spacing. Such local oscillators are often implemented using a frequency synthesizer and a voltage controlled oscillator. The signal from this local oscillator drives the mixers. Commonly, the local oscillator operates at the same frequency as the carrier frequency of the selected channel.

However, some local oscillators are designed to operate at approximately twice the frequency of the carrier signal. This is done to avoid the many problems, such as cross modulation and direct current (DC) offset, which arise when the local oscillator operates at exactly the same frequency as the carrier. Thus in these systems, the local oscillator signal is passed through a divider before being fed to the mixers. Additionally, in some of these designs, the phase shift required to obtain the Q component is also performed within the divider. However, even in these types of systems, a strong RF signal can modulate the local oscillator signal, thus causing tuner degradation.

Typically, the local oscillator consists of two external voltage-control oscillators (VCOs). The external VCOs are typically off-chip tank circuits, residing inside the set-top box and using the common transformer as a power source. These tank circuits commonly include four inductors and two hyper-abrupt varactor diodes. The external hyper-abrupt varactors commonly use 30 volts of tuning range, and have a ten-to-one capacitance, thus providing the large tuning range needed for broadband signals.

The problems with this traditional approach to broadband tuners are multiple. First, when the tank components are off-chip, the inductors will radiate like an antenna. Thus, these traditional tuners create high frequency radiation, which must be dealt with to avoid interference with other components on the board. Second, the common solution to the unwanted radiation is to add shielding. This solution makes the tank components larger and more difficult to integrate onto the board, thus requiring more board space and increasing the cost of producing the tuner. Third, the traditional off-chip tank circuits include 30 V hyper-abrupt varactor diodes, thus requiring the set-top box to include a 30 V tap off the transformer. This also increases the cost of producing the tuner by taking up valuable space inside the set-top box.

Integrated wideband tuners have been reported using multiple wideband RC oscillators. While these tuners reportedly solve the problems of coupling between the radio frequency and the local oscillator signals, DC offset and the need for a 30 V power supply, they do not solve the many other problems addressed by the present invention. In addition, they require a complicated multi-loop architecture to achieve desired phase-noise performance. This complicated multi-loop architecture is undesirable because of the added expense and difficulty in system-board design it creates.

Therefore, what is needed is a broadband tuner that does not require radiation shielding, generates less heat, is smaller, more robust, less expensive and easier to integrate into the system board.

SUMMARY OF THE INVENTION

In accordance with the purpose of the present invention, as broadly described herein, there is provided a fully integrated single-loop frequency synthesizer, which can serve as a local oscillator for a broadband tuner, thus allowing the creation of a single-chip solution for broadband applications.

A feature of the present invention is the integration of the tank circuits into the tuner chip through the use of multiple VCOs comprising narrow-tuning range varactors. This integration reduces the number of components required to make a broadband tuner. In this fashion, the present invention reduces the cost of producing a broadband tuner and makes system-board design easier.

An additional feature of the present invention is the elimination of the high frequency radiation associated with the inductors commonly used in broadband tuners. When the VCOs are on the chip, this radiation is eliminated, thus removing the need for shielding. In this fashion, the present invention further reduces the cost of producing a broadband tuner and makes system-board design easier.

According to a preferred embodiment of the present invention, a single-loop frequency synthesizer is fully integrated into a tuner chip to serve as the local oscillator, which feeds on-chip down-converting mixers. This integration is accomplished by combining a phase-locked loop (PLL) with multiple VCOs comprising narrow-tuning range varactors. This combination of a PLL and multiple VCOs enables the use of a method to build up coverage of the full broadband input (950–2150 MHz). In this fashion, the resulting broadband tuner is made smaller, cheaper and easier to use in system-board design.

In a preferred embodiment of the present invention, drift in the VCOs caused by heat is overcome by careful engineering. Each VCO is designed to overlap with its adjacent VCO. The size of this overlap, or breakpoint, is made large enough that the local oscillator can tolerate temperature drift in the VCOs. In this fashion, any drift in the VCOs caused by heat is prevented from adversely affecting the tuner.

According to another preferred embodiment of the present invention, careful engineering and a calibration method overcome the significant initial tolerance problems associated with the VCOs. A sufficient number of VCOs are provided such that whatever the initial tolerance shift, the full broadband spectrum can still be covered. This is possible because each on-chip VCO's initial tolerance shifts in a similar fashion with all the others. Thus, no frequency gaps between VCOs can arise. At start up, the VCOs are calibrated to determine the size and location of the breakpoints. In this fashion, the initial tolerance is effectively zeroed out.

According to a preferred embodiment of the present invention, the problem of coupling between the local oscillator (LO) signal and the incoming radio frequency (RF) signal is mediated by integrating the tank circuits into the chip and by using a 2/4 divider. RF to LO coupling is reduced by putting the VCOs, including their inductors, on the chip. Additionally, the VCOs in the local oscillator are designed to operate at a much higher frequency than the RF signal. During the calibration of the VCOs, it can be determined whether to divide the LO signal by two or by four before mixing the LO signal with the RF signal. This on-the-fly determination adds flexibility to the design of the VCOs, thereby making the resulting tuner more robust.

According to a preferred embodiment of the present invention, the initial calibration of the VCOs is accomplished by utilizing the lock detect output of the phase-locked loop and a binary search algorithm. For each VCO, the upper and lower edge is determined. The lower edge is the lowest frequency to which that VCO can be tuned, as identified by the PLL. The upper edge is the highest frequency to which that VCO can be tuned, as identified by the PLL. With this upper and lower edge information a look-up table is created such that, for each RX frequency, the appropriate VCO and VCO divider to use are known. In this fashion, the calibration of the VCOs is accomplished, and the local oscillator can thus be implemented on one tuner chip, as a single-loop frequency synthesizer using multiple on-chip VCOs. Thus, the resulting broadband tuner is made smaller, less expensive, more robust and easier to use by system-board designers.

Further features and advantages of the invention as well as the structure and operation of various embodiments of the invention are described in detail below with reference to the accompanying drawings.

DETAILED DESCRIPTION OF THE INVENTION

The present invention is directed toward a fully integrated single-loop frequency synthesizer and a fully integrated broadband tuner. The present invention includes various methods and circuit designs that enable a broadband tuner to be built on a single chip. Thus, the need for shielding is reduced or eliminated and less RF to LO coupling occurs. Additionally, in certain embodiments, the resulting broadband tuner is smaller, cheaper to produce and easier to integrate into system boards.

The present invention is disclosed and described herein in terms of an example DBS embodiment. However, after reading this description it will become apparent to one skilled in the art how to implement the invention in alternative embodiments and alternative applications. For example, although the present invention is disclosed in terms of a digital satellite system, those skilled in the art will understand that the broadband tuner design disclosed herein is applicable to any type of broadband receiver and may be implemented in a wide variety of broadband applications. As such, the description of this example embodiment should not be construed to limit the scope or breadth of the present invention.

Figure 1:
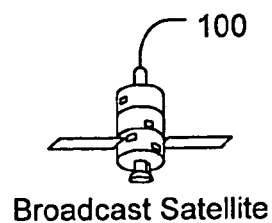
FIG. 1 is a block diagram depicting an example operational environment according to a preferred embodiment of the present invention.
Figure 1:
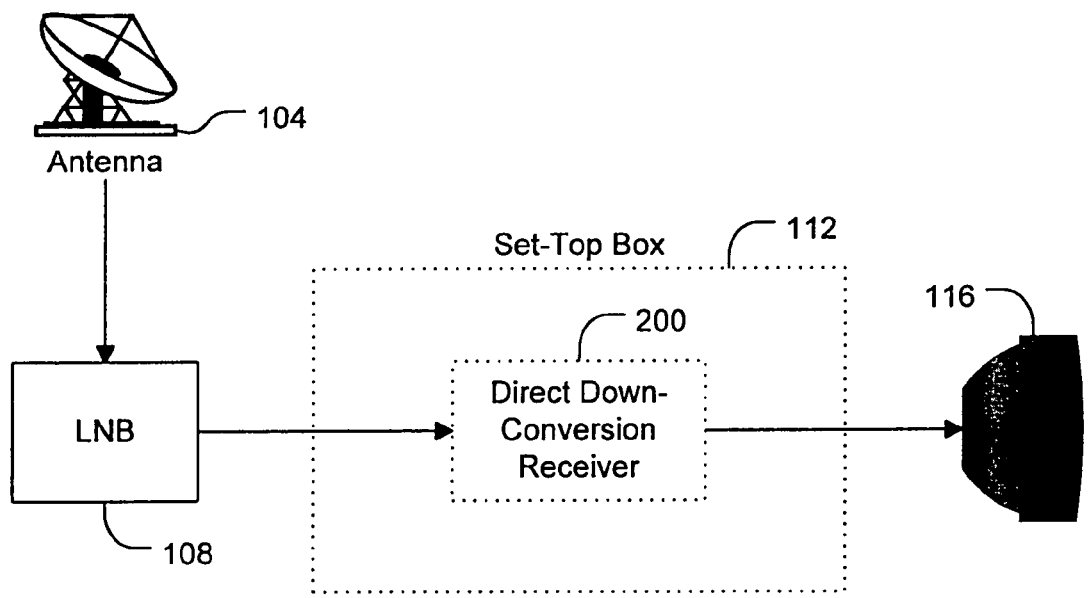

FIG. 1 is a block diagram depicting an example operational environment according to a preferred embodiment of the present invention. Referring now to FIG. 1, a broadcast satellite 100 transmits multiple channels over a broadband spectrum covering 12 to 14 GHz. This signal is received by an antenna 104. The signal is then passed through a low-noise block converter (LNB) 108, which takes the 12–14 GHz band signal received by the antenna 104 and converts it to a 950–2150 MHz band signal.

The signal then enters a set-top box 112, which allows a user to select a channel to view. Set-top box 112 contains other features and functions well understood by those skilled in the art and not essential to the functioning of the present invention. Set-top box 112 also contains a direct down-conversion receiver 200. The direct down-conversion receiver 200 generates data that is sent to a television 116 for viewing by the user.

Figure 2:
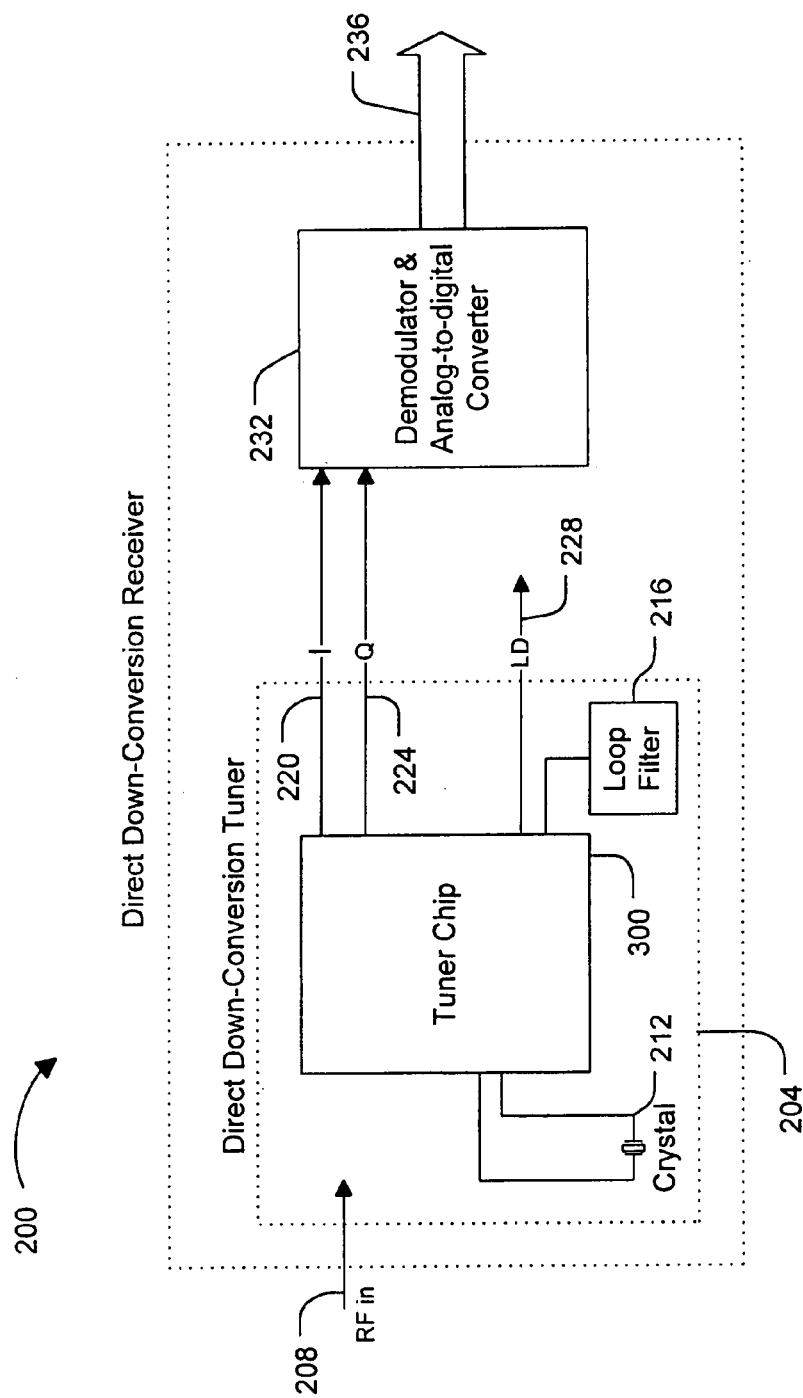
FIG. 2 is a block diagram depicting additional detail regarding one aspect of an example operational environment according to a preferred embodiment of the present invention.

FIG. 2 is a block diagram depicting additional detail regarding one aspect of an example operational environment according to a preferred embodiment of the present invention. Referring now to FIG. 2, the direct down-conversion receiver 200 is the same as that shown in FIG. 1. It has an input 208, which is the incoming signal from the LNB 108. It also has an output 236, which is the data sent to the television 116.

The direct down-conversion receiver 200 includes a direct down-conversion tuner 204 and a demodulator and analog-to-digital converter 232. The direct down-conversion tuner 204 outputs I and Q components 220 and 224. These I and Q components 220 and 224 are at baseband. The demodulator and analog-to-digital converter 232 takes these I and Q components 220 and 224, and converts them to digital output in a manner well known to those skilled in the art.

Still referring to FIG. 2, the direct down-conversion tuner 204 comprises a tuner chip 300, a crystal 212 and a loop filter 216. The crystal 212 provides the tuner chip 300 with a reference frequency in a manner well known in the relevant art(s). In a preferred embodiment, crystal 212 is a 10.11 MHz crystal. Also in a preferred embodiment, the tuner chip 300 has a lock detect output 228 that is fed to the demodulator and analog-to-digital converter 232. This is done to enable the calibration of the tuner chip 300.

However, those skilled in the relevant art(s) will understand that in alternative embodiments, the lock detect output 228 from the phase-locked loop inside the tuner chip 300 may be directed and used in a multitude of ways, all of which enable the calibration as disclosed herein, including directing and using the lock detect 228 entirely within tuner chip 300.

Finally, in a preferred embodiment, loop filter 216 is a low-pass filter provided for use with the phase-locked loop inside tuner chip 300 in a manner well known in the relevant art(s). In addition, alternative embodiments include those having loop filter 216 contained within tuner chip 300.

While the present invention is disclosed in terms of a direct down-conversion receiver used as part of a DBS intermediate frequency (IF) receiver system, those skilled in the relevant art(s) will understand that the present invention is applicable to innumerable broadband applications, including, for example, a general purpose IF broadband receiver.

Figure 3:
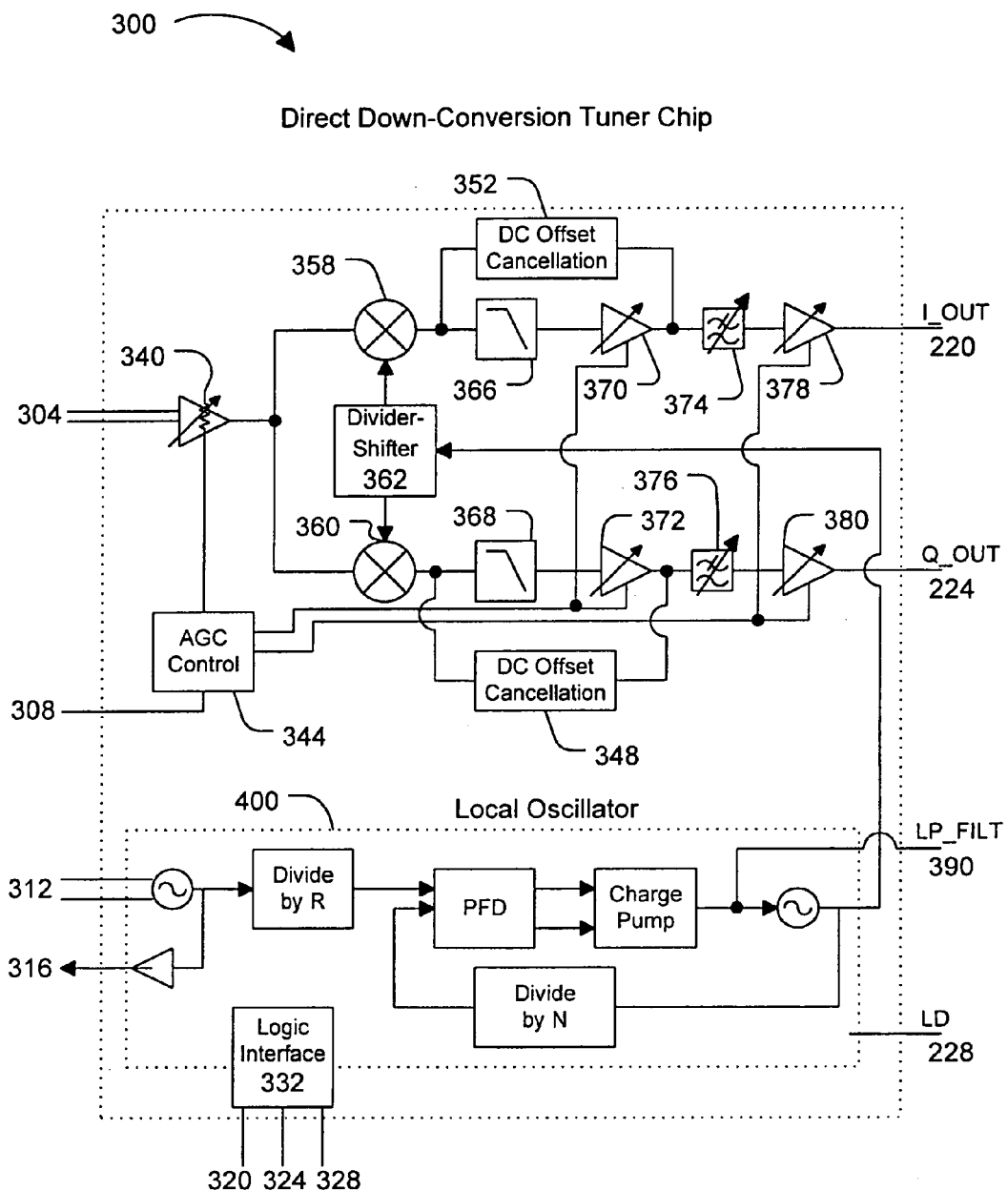
FIG. 3 is a block diagram depicting the components of a direct down-conversion tuner chip according to a preferred embodiment of the present invention.

FIG. 3 is a block diagram depicting the components of a direct down-conversion tuner chip according to a preferred embodiment of the present invention. Referring now to FIG. 3, the direct down-conversion tuner chip 300 comprises multiple inputs, outputs and components. RF input 304 is the RF signal from the LNB 108. In a preferred embodiment, RF input 304 is provided on two balanced pins. Automatic gain control (AGC) input 308 is a DC voltage that, in a preferred embodiment, controls the gain of RF attenuator 340 and AGC amplifiers 370, 372, 378 and 380. Reference frequency input 312 is the input from the crystal 212.

Check reference output 316 provides the reference clock for the demodulator and analog-to-digital converter 232 in a manner well known in the relevant art(s). I output 220 is the in-phase component of the channel selected. Q output 224 is the quadrature component of the channel selected. In a preferred embodiment, loop filter output 390 connects to loop filter 216, thus providing the loop filter component of the PLL within the local oscillator 400. Finally, in a preferred embodiment lock detect output 228 enables the calibration of the direct down-conversion tuner chip 300 disclosed herein. Alternative embodiments include other means for monitoring the lock detect output 228 as described above.

Logic interface 332 is coupled to the local oscillator 400 and to the divider-shifter 362. This coupling enables logic interface 332 to control the behavior of both the local oscillator 400 and the divider-shifter 362 in the manner described herein. Logic interface 332 includes digital storage registers as needed. Those skilled in the relevant art(s) will understand when and how many such digital storage registers are needed given the disclosure herein and the particular application. In a preferred embodiment, logic interface 332 is controlled via a three-line bus. This three-line bus comprises a serial bus clock signal 320, a serial bus latch enable 324 and a serial bus data line 328.

AGC Control 344 splits the incoming AGC input 308 such that it is provided to multiple components within the direct down-conversion tuner chip 300. One such component is RF attenuator 340, which is a voltage controlled attenuator. In a preferred embodiment, RF input 304 is provided to RF attenuator 340, which increases the amplitude variations in the receive signal. This is done to optimize the spurious free dynamic range of the receiver for various input signal levels.

Local oscillator 400 feeds the mixers 358 and 360 via the divider-shifter 362. In a preferred embodiment, the output of the local oscillator 400 is selected to be exactly twice or four times the desired receive frequency. This is done to minimize the RF to LO coupling. The output from the local oscillator 400 is then divided by the appropriate number in the divider-shifter 362 before being fed to the mixers 358 and 360. Additionally, the divider-shifter 362 shifts the phase of the signal provided to the mixer 360 by ninety degrees. This is done to obtain the quadrature component of the received signal.

The output of the mixers 358 and 360 is the difference in frequency between RF signal 304 and the oscillator signals from the divider-shifter 362. Thus, when RF signal 304 and the oscillator signals from divider-shifter 362 have the same frequency, the RF is removed thereby converting the signal to baseband. In a preferred embodiment, the outputs of mixers 358 and 360 are then passed through two separate fixed low-pass filters 366 and 368, and two separate AGC amplifiers 370 and 372. The fixed low-pass filters 366 and 368 aid in tuning out any part of the RF signal not within the selected channel. The AGC amplifiers 370 and 372 maintain the signal of the selected channel at a constant amplitude, regardless of variations in the receive signal level. This is done to keep the signal amplitude within the narrow range required by the demodulator and analog-to-digital converter 232.

Also in a preferred embodiment, DC offset cancellation components 348 and 352 bridge the fixed low-pass filters 366 and 368, and the AGC amplifiers 370 and 372 to cancel any DC offset for the I and Q channels. This is done because LO leaks to RF, mixed down to DC. If the DC offset is not cancelled, it will clip the amplifier chain and the analog-to-digital converter. In a preferred embodiment, DC offset cancellation components 348 and 352 are connected to two off-chip capacitors. However, alternative embodiments include other methods and apparatus for canceling DC offset, such as off-chip alternating current (AC) coupling via a series capacitor.

In a preferred embodiment, variable low-pass filters 374 and 376 aid in tuning out any part of the RF signal not within the selected channel, thus insuring consistent baseband output. In alternative embodiments, these variable low-pass filters 374 and 376 are fixed low-pass filters or other components able to help insure a proper baseband output, such as off-chip L-C filters. AGC amplifiers 378 and 380 maintain the signal of the selected channel at a constant amplitude, regardless of variations in the receive signal level. This is done to keep the signal amplitude within the narrow range required by the demodulator and analog-to-digital converter 232.

As mentioned previously, the present invention is described herein in terms of this example DBS environment. However, it should be remembered that description in these terms is provided for ease of discussion only. After reading the description herein, it will become apparent to one skilled in the relevant art(s) that the present invention can be implemented in any of a number of alternative embodiments and alternative broadband applications. For example, although the disclosure provided herein shows the demodulator as separate from the tuner, the present invention may be implemented on a single integrated circuit with both the tuner and the demodulator on the same chip. As such, the description of the present invention in terms of this example embodiment should not be construed to limit the scope or breadth of the present invention.

Figure 4:
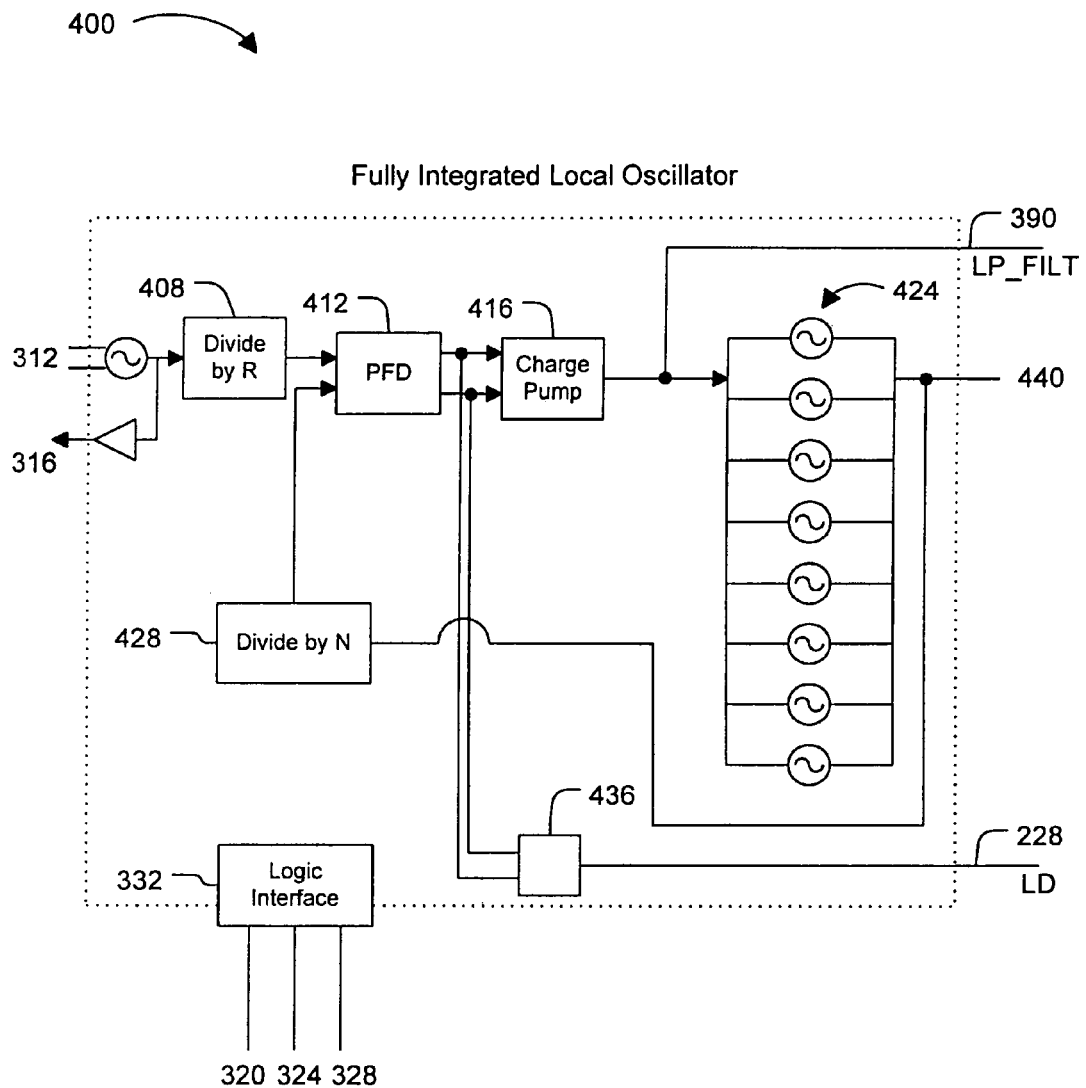
FIG. 4 is a block diagram depicting the components of a local oscillator according to a preferred embodiment of the present invention.

FIG. 4 is a block diagram depicting the components of a local oscillator (LO) according to a preferred embodiment of the present invention. Referring now to FIG. 4, the LO 400 from FIG. 3 is now presented in greater detail. Reference frequency input 312, clock reference output 316, loop filter output 390, and lock detect output 228 are the same as described above. Likewise, the three-line bus for logic interface 332 is also the same, comprising a serial bus clock signal 320, a serial bus latch enable 324 and a serial bus data line 328.

In a preferred embodiment, logic interface 332 is coupled to a divide by R block 408, a divide by N block 428, programmable charge pump 416 and voltage controlled oscillator (VCO) bank 424. In a preferred embodiment, divide by R block 408 is included in LO 400 to allow the direct down-conversion tuner chip 300 the ability to be used in multiple broadband receiver applications. R is determined by the demodulator's capability to correct any frequency offsets. In a preferred embodiment, in which reference frequency input 312 is at 10.11 MHz, divide by R block 408 is programmed by logic interface 332 with two bits, and R will be either 10, 20 or 40, depending on the phase comparison frequency required, which may be either 1 MHz, 500 kHz or 250 kHz respectively.

Divide by N block 428 takes the LO output 440 and divides it by the appropriate number to provide the desired compare frequency input to phase/frequency detector (PFD) 412. N is determined by the center frequency of the channel selected. Divide by N block 428 is programmed by logic interface 332. In a preferred embodiment, divide by N block 428 comprises a 32/33 prescaler, a 9-bit B-counter, a 5-bit A-counter and a fixed divide-by-2 block to cover the entire VCO output frequency range (2200–4400 MHz) for a minimum reference frequency of 250 kHz.

PFD 412 and charge pump 416 are standard components of a phase-locked loop and function in a manner well known in the relevant art. For further details of this functioning, see the background set forth in U.S. patent application Ser. No. 09/314,898, filed on May 19, 1999, which shares a common assignee with the present application. This application is incorporated herein by reference as though set forth in full.

In addition to this functionality of the charge pump 416, in a preferred embodiment, charge pump 416 is programmable by logic interface 332 such that charge pump 416 can output a range of currents and can reverse its output polarity as required by the particular VCO being utilized in the VCO bank 424. Also in a preferred embodiment, loop filter output 390 attaches between charge pump 416 and VCO bank 424. Loop filter output 390 connects to loop filter 216, thus converting the current output from charge pump 416 into a voltage output for driving the VCOs within VCO bank 424. In alternative embodiments, different PLL architectures are used. For example, the present invention may be implemented with a fractional-N PLL or a multi loop PLL, instead of the PLL architecture disclosed herein.

VCO bank 424 comprises multiple VCOs. The number of VCOs required is determined by the range of frequencies that must be covered, the amount of overlap required for the particular application, the tuning range and the center frequency drift of each on-chip VCO. One skilled in the relevant art will understand how to determine the proper number of VCOs given these variables. In a preferred embodiment, there are eight VCOs, each having a twelve percent tuning range and each being required to cover ten percent of the overall frequency range. In this embodiment, each VCO has two percent overlap, thus eliminating the need for any recalibration after start-up due to shifts in the VCOs' tuning range. In addition, in this preferred embodiment, the eight VCOs cover enough spectrum to allow full coverage of the broadband range 950–2150 MHz, despite the nominal edge tolerance of plus or minus six percent for the VCOs comprising VCO bank 424.

Each VCO in VCO bank 424 is isolated from the rest of the circuit by a switch (not shown). Logic interface 332 is coupled to these switches such that only one VCO is switched on at a time. During calibration, logic interface 332 switches on the VCOs in VCO bank 424 as described in detail below in the description of FIG. 5. During normal operation of LO 400, logic interface 332 switches on the appropriate VCO in VCO bank 424 given the selected channel. Thus VCO bank 424 can be thought of a single VCO capable of generating all the frequencies necessary to cover the full broadband spectrum.

Local oscillator output 440 is the signal provided to the divider-shifter 362, and thereby the mixers 358 and 360. During normal operation, the selected VCO in VCO bank 424 is phase locked to the reference frequency, thus providing a consistent local oscillator output 440. In addition, lock detect output 228 is created by lock detect logic 436. This lock detect logic 436 is a standard component of phase-locked loops and may be implemented in different ways in alternative embodiments. For example, in one embodiment a simple nor-gate can be placed across the output of the PFD.

Figure 5:
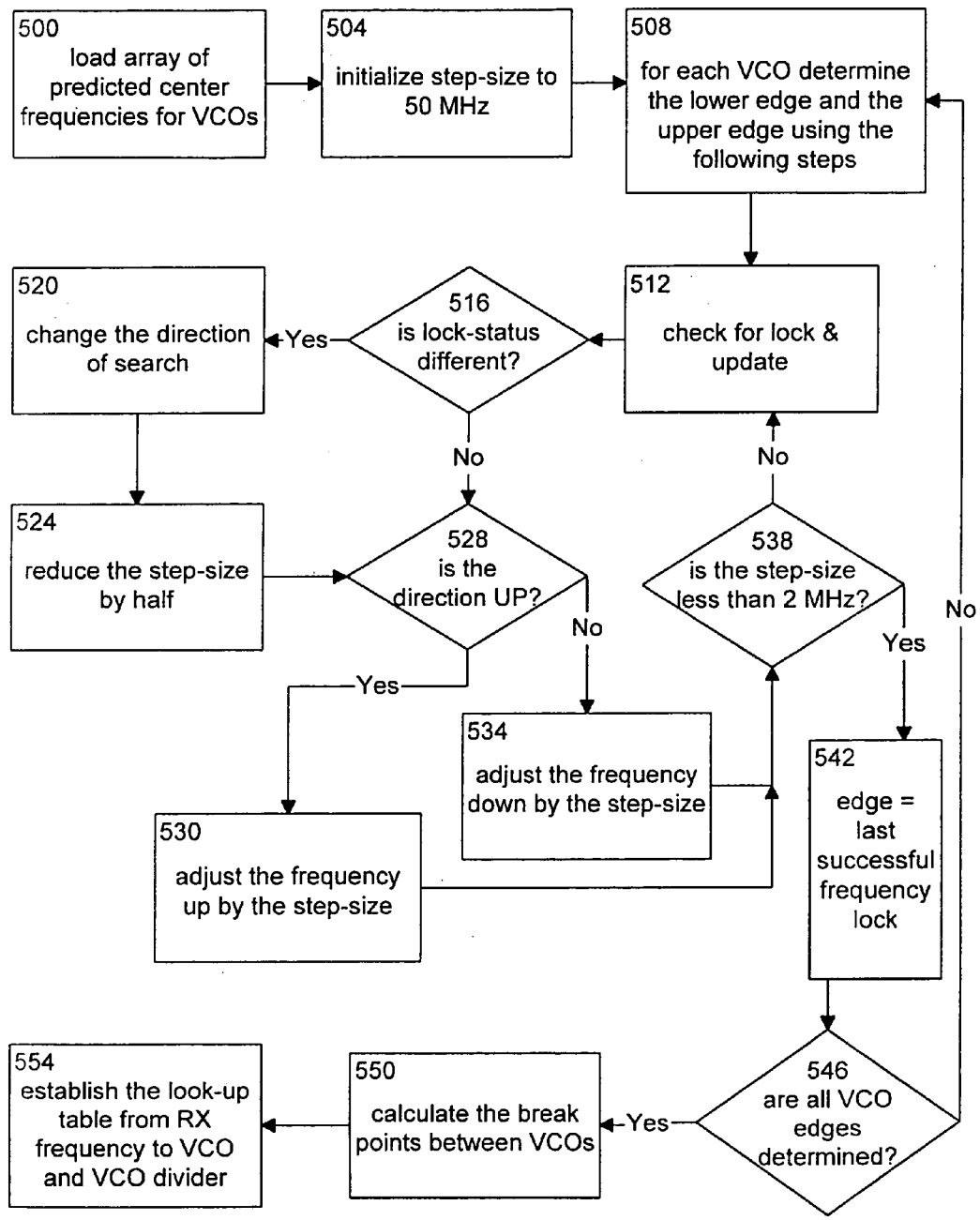
FIG. 5 is a flow chart depicting a method for calibrating the VCOs according to a preferred embodiment of the present invention.

FIG. 5 is a flow chart depicting a method for calibrating the VCOs according to a preferred embodiment of the present invention. Referring now to FIG. 5, the process begins with step 500, in which the predicted center frequencies for the VCOs are retrieved from storage. In a preferred embodiment, these center frequencies are stored in an array in main memory. In step 504, the initial step-size is retrieved from storage. In a preferred embodiment, the step-size is 50 MHz. In alternative embodiments, the initial values for predicted VCO center frequencies and step-size are stored in memory that does not require pre-loading, thus eliminating steps 500 and 504 from the calibration method.

In step 508, the process splits and steps 512 through 546 are performed twice for each VCO. For each VCO, the process identifies the upper and lower edges of that VCO. In one embodiment, the split in the process in step 508 is performed using recursive procedure calls, but alternative embodiments include standard loop structures or other process control methods that are well known in the relevant art(s). In a recursive procedure call embodiment, steps 512 through 542 are performed in a single subroutine that is called twice for each VCO and that includes at least four local parameters: lock-status, last-frequency-lock, step-size and direction.

In an alternative embodiment, steps 512 through 546 are performed twice for only one VCO. The upper and lower edges of the remaining VCOs are then calculated from the upper and lower edges of the processed VCO. The nature of these calculations will depend on the VCO specifications and the particular application.

In step 512, the lock detect output of the PLL is checked to determine if the current VCO has successfully locked onto the desired frequency. In a preferred embodiment, this part of step 512 is performed multiple times to give the PLL sufficient time to reach a stable state. One skilled in the art will understand how to determine the optimal number of checks given the particular application. Once these checks are completed, step 512 updates last-frequency-lock if a lock has been established. In step 516, the current status of the lock detect is compared with the prior lock-status. If the lock-status has changed, control passes to step 520. If the lock-status is the same, control passes to step 528.

In a preferred embodiment, the initial lock-status will be locked, and the initial last-lock-frequency will be the predicted center frequency for the current VCO. In this particular preferred embodiment, each VCO is presumed capable of locking onto its predicted center frequency. However, in alternative embodiments, step 516 will recognize if no lock has yet been established for the current VCO (e.g. by checking the last-frequency-lock variable, which would be initialized to zero in these alternative embodiments). In that event, step 516 will include additional steps to search above and below the predicted center frequency to establish an initial lock, and thus set the last-frequency-lock variable, before continuing the calibration process as described herein. Note that additional alternative embodiments include finding an initial lock for the current VCO before first performing step 512 for that VCO.

In step 520, the direction of the VCO edge searching is changed. This change is either from up to down, or from down to up. In step 524, the step-size is reduced by half. This represents a preferred embodiment in which the edge search is a binary search algorithm. However, alternative embodiments include other search algorithms, which are well known in the relevant art(s).

If the lock-status is the same in step 516, or once step 524 is completed, control passes to step 528. In step 528, the search direction is checked. If the search direction is up, the tuning frequency is adjusted upward by the current step-size in step 530. If the search direction is down, the tuning frequency is adjusted downward by the current step-size in step 534. Subsequent to both these steps, the step-size is compared against a minimum value in step 538. If the step-size is less than the minimum, the search is terminated. In a preferred embodiment, the minimum step-size is 2 MHz. However, alternative embodiments will include many different minimum step-sizes depending on the particular application.

If the minimum step-size has not been reached, control passes from step 538 to step 512. If the minimum step-size has been reached, control passes from step 538 to step 542. Step 542 sets the edge value being searched for to the last-frequency-lock value. Then step 546 checks if all the edges for all the VCOs have been determined. If not, control passes to step 508. In a sense, steps 508 and 546 are the same. Depending on the particular implementation of the method disclosed herein, one or the other of these steps will not be needed, or these steps will be one and the same. The separation of this one step into steps 508 and 546 is done here for the purpose of clarity.

Once all the VCO edges have been determined, control passes to step 550. In this step, the breakpoints between the VCOs are calculated. In a preferred embodiment, the breakpoints are calculated in the following manner. The highest breakpoint is set to the upper edge of the last VCO, which will be referred to as $VCO_N$. For each set of adjacent VCOs, A and B ($VCO_A$ being the lower VCO):

$$BreakPoint_{AB} = (UpperEdge_A - LowerEdge_B) \times 0.6 + LowerEdge_B;$$

where $BreakPoint_{AB}$ is the frequency below which $VCO_A$ will be used, and above which $VCO_B$ will be used.

Additionally, in a preferred embodiment, the last two VCOs are used for the very lowest carrier frequencies. This is accomplished by dividing the VCO output from the last two VCOs by four instead of two. This particular embodiment is designed to minimize the total number of VCOs and the RF to LO coupling. Thus, there are two additional pseudo VCOs below $VCO_1$. These will be referred to as $VCO_0$ and $VCO_{-1}$. The lowest breakpoint is set to half the lower edge of the VCO just before the last VCO; that is $VCO_{N-1}/2$. The other two breakpoints are calculated as follows:

$$BreakPoint_{(-1,0)} = ((UpperEdge_{N-1} - LowerEdge_N) \times 0.6 + LowerEdge_N) \div 2;$$

$$BreakPoint_{(0,1)} = ((UpperEdge_N \div 2) - LowerEdge_1) \times 0.6 + LowerEdge_1;$$

where $BreakPoint_{(-1,0)}$ is the frequency below which $VCO_{N-1}$ will be used, and above which $VCO_N$ will be used; and where $BreakPoint_{(0,1)}$ is the frequency below which $VCO_N$ will be used, and above which $VCO_1$ will be used.

Alternative embodiments will include additional VCOs in place of the pseudo VCOs and will include various methods of calculating the breakpoints depending on the particular application and the design of the VCOs used.

Following the breakpoint calculations in step 550, a means for determining which VCO to use and how to divide its output is established in step 554. In a preferred embodiment, step 554 creates a look-up table. This table contains two entries for each carrier frequency. The first entry specifies which VCO to use, and the second entry specifies the VCO divider (either /2 or /4). Step 554 is accomplished by comparing the carrier frequencies to the breakpoints.

Each carrier frequency will fall between two breakpoints: $BreakPoint_{AB}$ and $BreakPoint_{BC}$. The first entry for each such carrier frequency will be $VCO_B$. The second entry for each such carrier frequency will be /2. However, if $VCO_B$ is pseudo $VCO_{-1}$, the first entry for this carrier frequency will be $VCO_{N-1}$, and the second entry will be /4. Likewise, if $VCO_B$ is pseudo $VCO_0$, the first entry for this carrier frequency will be $VCO_N$, and the second entry will be /4. Although this step is disclosed in terms of a look-up table, it will be apparent to those skilled in the relevant art(s) that step 554 can be implemented with a number of different data structures and/or process steps, and these alternative embodiments are part of the present invention.

Figure 6:
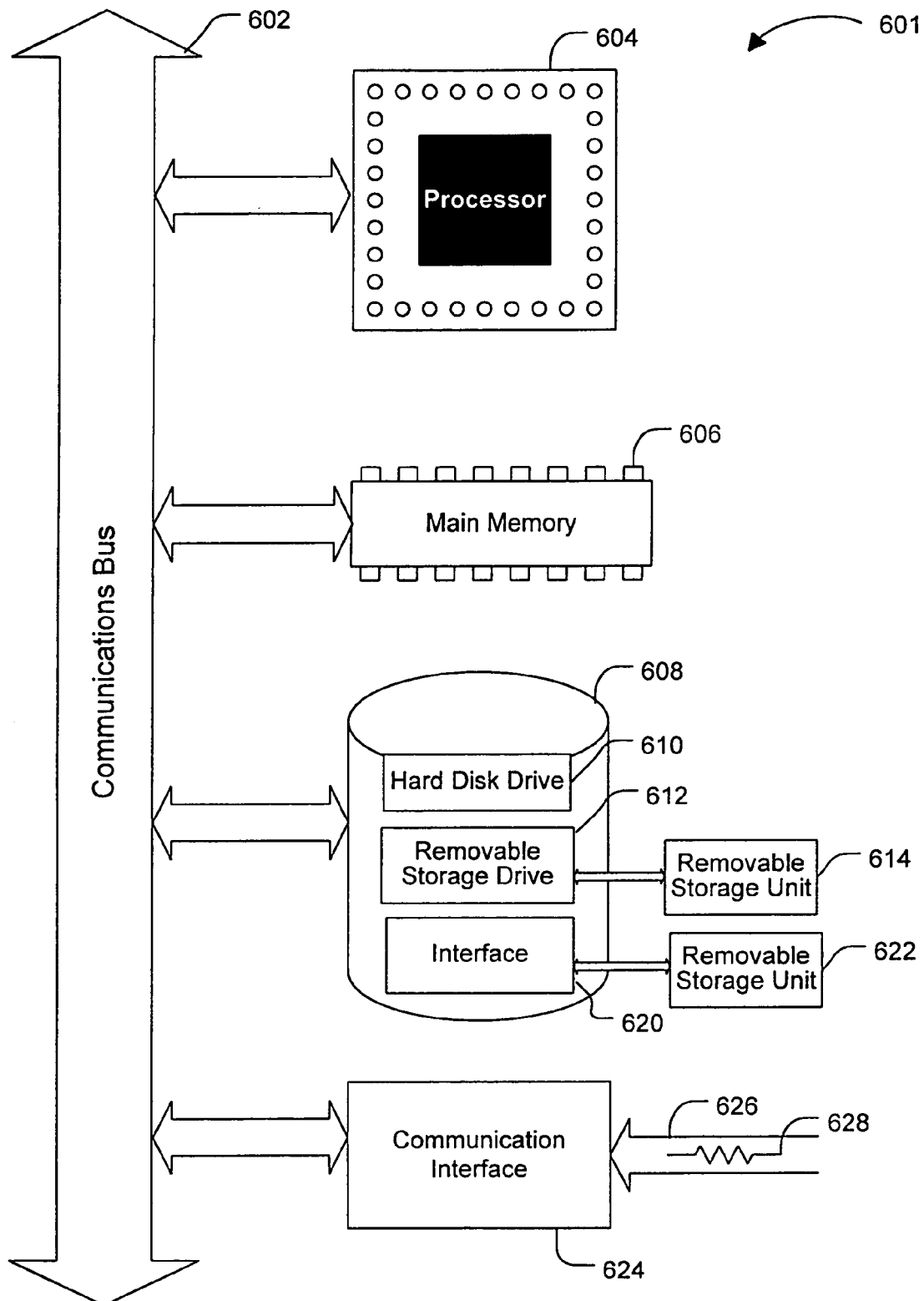
FIG. 6 is a block diagram illustrating an example computer system in which elements and functionality of the invention are implemented according to one embodiment of the present invention.

FIG. 6 is a block diagram illustrating an example computer system in which elements and functionality of the invention are implemented according to one embodiment of the present invention. The present invention may be implemented using hardware, software or a combination thereof and may be implemented in a computer system or other processing system. In fact, in one embodiment, the invention is directed toward a computer system capable of carrying out the functionality described herein. An example computer system 601 is shown in FIG. 6. The computer system 601 includes one or more processors, such as processor 604. The processor 604 is connected to a communication bus 602.

Various software embodiments are described in terms of this example computer system. After reading this description, it will become apparent to a person skilled in the relevant art(s) how to implement the invention using other computer systems and/or computer architectures. For example, one such implementation would include a microcontroller, as the processor 604, running the code representing the methods described herein.

Computer system 601 also includes a main memory 606, preferably read only memory (ROM) or flash memory, and can also include a secondary memory 608. The secondary memory 608 can include, for example, a hard disk drive 610 and/or a removable storage drive 612, representing a floppy disk drive, a magnetic tape drive, an optical disk drive, etc. The removable storage drive 612 reads from and/or writes to a removable storage unit 614 in a well-known manner. Removable storage unit 614, represents a floppy disk, magnetic tape, optical disk, etc. which is read by and written to by removable storage drive 612. As will be appreciated, the removable storage unit 614 includes a computer usable storage medium having stored therein computer software and/or data.

In alternative embodiments, secondary memory 608 may include other similar means for allowing computer programs or other instructions to be loaded into computer system 601. Such means can include, for example, a removable storage unit 622 and an interface 620. Examples of such can include a program cartridge and cartridge interface (such as that found in video game devices), a removable memory chip (such as an EPROM, or PROM) and associated socket, and other removable storage units 622 and interfaces 620 which allow software and data to be transferred from the removable storage unit 622 to computer system 601.

Computer system 601 can also include a communications interface 624. Communications interface 624 allows software and data to be transferred between computer system 601 and external devices. Examples of communications interface 624 can include a modem, a network interface (such as an Ethernet card), a communications port, a PCMCIA slot and card, etc. Software and data transferred via communications interface 624 are in the form of signals which can be electronic, electromagnetic, optical or other signals capable of being received by communications interface 624. These signals 628 are provided to communications interface 624 via a channel 626. This channel 626 carries signals 628 and can be implemented using wire or cable, fiber optics, a phone line, a cellular phone link, an RF link or other communications channels.

In this document, the terms "computer program medium" and "computer usable medium" are used to generally refer to media such as main memory 606, removable storage drive 612, a hard disk installed in hard disk drive 610, and signals 628. These computer program products are means for providing software to computer system 601

Computer programs (also called computer control logic) are stored in main memory 606 and/or secondary memory 608. Computer programs can also be received via communications interface 624. Such computer programs, when executed, enable the computer system 601 to perform the features of the present invention as discussed herein. In particular, the computer programs, when executed, enable the processor 604 to perform the features of the present invention. Accordingly, such computer programs represent controllers of the computer system 601.

In an embodiment where the invention is implemented using software, the software may be stored in a computer program product and loaded into computer system 601 using hard drive 610, removable storage drive 612, interface 620 or communications interface 624. In addition, the computer program product may be pre-stored in main memory 606 and thereby be part of computer system 601 at creation. The control logic (software), when executed by the processor 604, causes the processor 604 to perform the functions of the invention as described herein.

In another embodiment, the invention is implemented primarily in hardware using, for example, hardware components such as application specific integrated circuits ("ASICs"). Implementation of the hardware state machine so as to perform the functions described herein will be apparent to persons skilled in the relevant art(s).

In yet another embodiment, the invention is implemented using a combination of both hardware and software.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for calibrating a local oscillator, comprising a plurality of voltage controlled oscillators, integrated on a single semiconductor chip for use in a broadband tuner, comprising the steps of:

selecting an initial frequency;

checking a lock detect output of a phase-locked loop iteratively for frequencies above and below the initial frequency to determine a lower edge and an upper edge of a set of frequencies to which a current voltage controlled oscillator can be tuned;

performing said selecting and checking steps for each voltage controlled oscillator;

calculating breakpoints between each voltage controlled oscillator from a set of upper and lower edges thereby minimizing the probability of one of the voltage controlled oscillators being used to tune to a frequency near either the upper or lower edge of that voltage controlled oscillator's tuning range; and generating a look-up table for identifying which voltage controlled oscillator to use given a specified carrier frequency.

2. The method of claim 1, wherein said checking step is performed using a binary search algorithm.

3. The method of claim 2, wherein the binary search uses an initial step size between ten and fifty percent of the predicted bandwidth of the current voltage controlled oscillator.

4. The method of claim 1, wherein said selecting step uses a predicted center frequency for the current voltage controlled oscillator.

5. The method of claim 1, wherein said generating step further comprises generating a set of divide ratios to apply to an output of the local oscillator for inclusion in the look-up table.

6. A method for calibrating a local oscillator, comprising a plurality of voltage controlled oscillators, integrated on a single semiconductor chip for use in a broadband tuner, comprising the steps of:

selecting an initial frequency;

checking a lock detect output of a phase-locked loop iteratively for frequencies above and below the initial frequency to determine a lower edge and an upper edge of a set of frequencies to which a current voltage controlled oscillator can be tuned;

performing said selecting and checking steps for each voltage controlled oscillator; and calculating breakpoints between each voltage controlled oscillator from a set of upper and lower edges thereby minimizing the probability of one of the voltage controlled oscillators being used to tune to a frequency near either the upper or lower edge of that voltage controlled oscillator's tuning range, wherein said calculating step further comprises calculating breakpoints for at least one pseudo voltage controlled oscillator.

7. The method of claim 6, further comprising the step of:

generating a look-up table for identifying which voltage controlled oscillator to use, and a divide ratio to apply to an output of the local oscillator, given a specified carrier frequency.

8. The method of claim 1, wherein the method is performed once at start-up.

* * * * *